United States Patent

Fukushi

[11] Patent Number: 5,883,930
[45] Date of Patent: Mar. 16, 1999

[54] DIGITAL PLL CIRCUIT AND ACTUATING METHOD

[75] Inventor: Mikio Fukushi, Tokyo, Japan

[73] Assignee: NEC Corporation, Japan

[21] Appl. No.: 846,886

[22] Filed: May 1, 1997

[30] Foreign Application Priority Data

May 2, 1996 [JP] Japan ................................. 8-111488

[51] Int. Cl.$^6$ ................................................ H03D 3/24
[52] U.S. Cl. ........................................ 375/376; 327/156
[58] Field of Search .................................. 375/376, 375, 375/371, 373, 326, 327, 215, 294; 329/307, 325, 360; 332/127; 455/260; 327/156, 161

[56] References Cited

U.S. PATENT DOCUMENTS

| 4,375,694 | 3/1983 | Kuhn | 375/120 |
| 4,423,390 | 12/1983 | Waters | 331/4 |
| 4,780,844 | 10/1988 | Keller | 364/900 |
| 5,381,116 | 1/1995 | Nuckolls et al. | 331/1 |
| 5,539,357 | 7/1996 | Rumreich | 331/17 |
| 5,572,157 | 11/1996 | Takashi et al. | 327/156 |
| 5,572,558 | 11/1996 | Beherns | 375/376 |
| 5,598,448 | 1/1997 | Girardeau, Jr. | 375/376 |

FOREIGN PATENT DOCUMENTS 64-48519   2/1989   Japan .

OTHER PUBLICATIONS

M. Hata, "Examples of design of PLL control circuits", Dec. 18, 1987, p. 38.

*Primary Examiner*—Jason Chan
*Assistant Examiner*—Jean B. Corrielus
*Attorney, Agent, or Firm*—Ostrolenk, Faber, Gerb & Soffen, LLP

[57] ABSTRACT

In a DPLL circuit used in a receiver for radio data communication employing the GMSK modulation system, a data latch circuit 23 and subtractor 24 find the phase information difference for each symbol from the incoming phase data. A modulation component removal circuit 25 removes the modulation component from the phase information difference. A frequency error calculating circuit 26 integrates the phase information difference over an interval of n symbols, multiplies this integrated value by 1/n, and takes the result as the mean frequency error value for the interval of n symbols, and then outputs this to loop filter 32. A phase error calculating circuit 27 further integrates over an interval of n symbols the integrated value from the frequency error calculating circuit, and multiplies the result by 2/n. Adder 28 adds an initial phase latched by a data latch circuit 22 to the output of the phase error calculating circuit, and outputs the result to NCO 33 as the phase error value. Operation of loop unit 36 is commenced with a timing that is preset by the mean frequency error value and phase error value.

5 Claims, 11 Drawing Sheets

DIGITAL PLL CIRCUIT AND ACTUATING METHOD

BACKGROUND OF THE INVENTION

1. Field of the Invention

The present invention relates to a digital PLL circuit, and more particularly relates to a method of initial setting of a digital PLL circuit employed in digital communication using for example GMSK (Gaussian filtered Minimum Shift Keying).

2. Description of the Related Art

In multi-directional communication systems in which communication is performed in bursts, systems using PSK (Phase Shift Keying) modulation are common. In such PSK systems, drift of the frequency of the carrier wave (i.e. frequency offset) produces phase demodulation distortion, which severely impacts the symbol error rate characteristic. A device is therefore necessary to automatically compensate for the amount of phase rotation produced by frequency offset.

A receiver having means for removing the effect of frequency offset, such as phase synchronization detection devices etc. have been proposed including phase-locked loop (PLL) type devices. In these devices, the frequency of oscillation of a phase-locked oscillator is made to automatically track the input frequency by regenerating the carrier wave and performing phase comparison between the regenerated wave and the input wave. The relationship of input signal to noise ratio, and error rate in such a synchronized detection device is said to be superior to that of differential detection.

A type of PLL type phase-locked detection devices that has recently attracted attention is the digital PLL (DPLL). This is due to the characteristic features of a digital PLL, namely that, compared with an analog PLL, it has a larger capture range, is less effected by oscillations of the input signal, and can easily be implemented as an integrated circuit IC.

Figure 1:
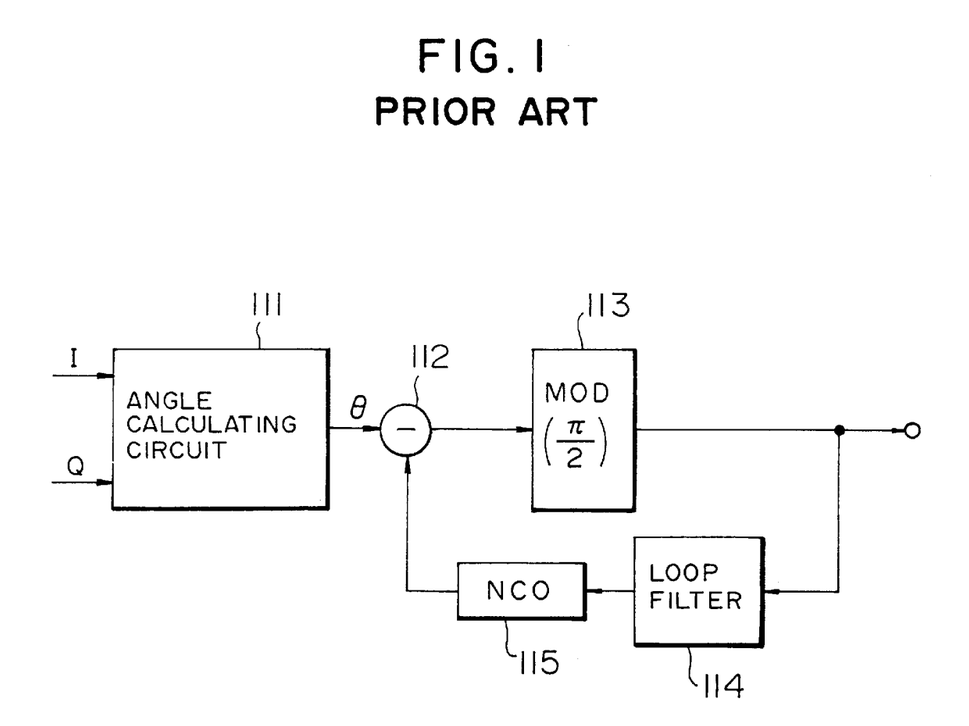
FIG. 1 is a block diagram of a conventional DPLL circuit.

FIG. 1 shows an example of a prior art DPLL circuit. This DPLL circuit is called a phase calculation signal processing type DPLL, and is constituted of an angle calculation circuit 111 that finds the phase angle θ of the signal from the in-phase component (I) and quadrature component (Q) from a sub-synchronous detection unit (not shown), a subtractor 112 adapted to function as a phase comparison circuit, a phase adjustment circuit (MOD) 113, a loop filter 114, and a numerically controlled oscillator (NCO) 115. Further characteristic advantages of this DPLL, circuit are that it has excellent noise characteristics and synchronization characteristics, and enables high carrier frequencies to be used. Such a DPLL circuit is described in "Examples of design of PLL control circuits" edited by M. Hata, published on 18 Dec. 1987.

Although such a digital PLL is superior to an analog PLL in many respects, it does have the drawback that it requires a lock-in time usually corresponding to a few tens of symbols. Various proposals have been made to reduce this lock-in time of a digital PLL.

Figure 2:
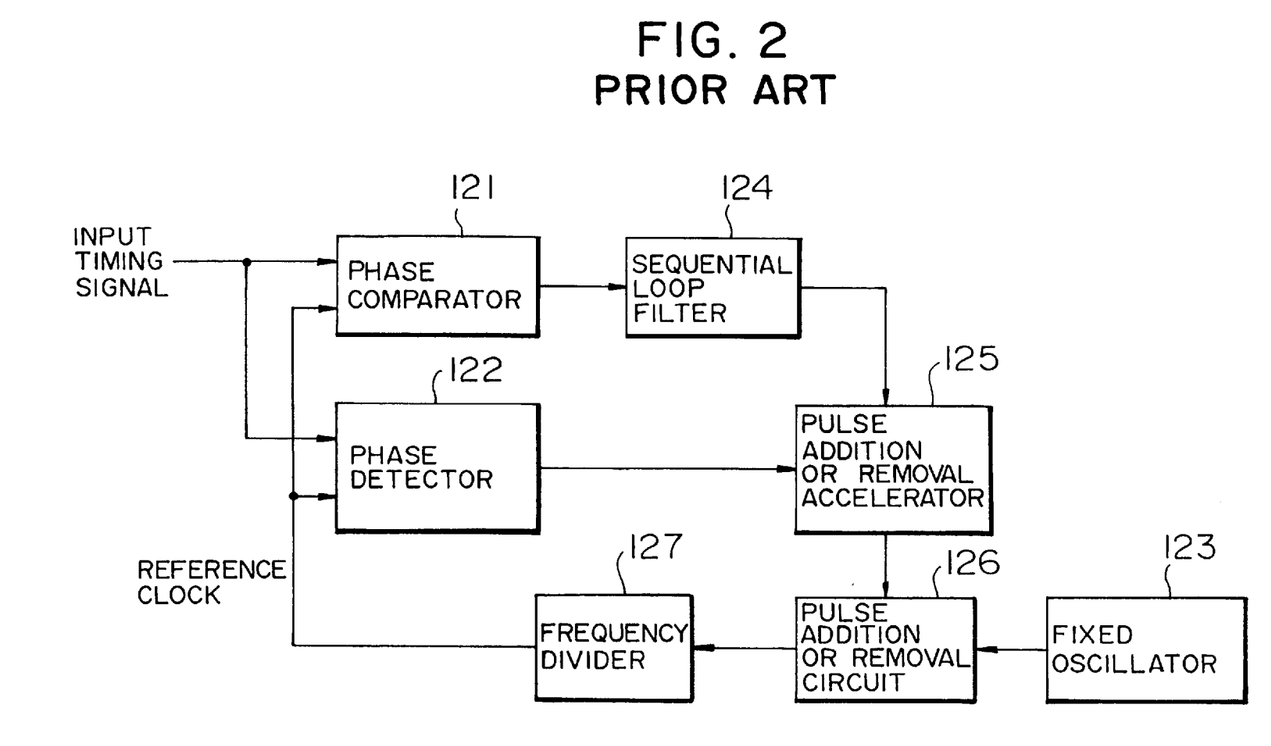
FIG. 2 is a block diagram of a conventional DPLL, circuit provided with means for shortening the lock-in time.

For example, Japanese Unexamined Patent Publication No. SHO 64-48519 entiled "DPLL circuit whose lock-in time can be automatically controlled" discloses a circuit, as shown in FIG. 2. It may be noted that the DPLL circuit of FIG. 2 differs from the DPLL circuit of FIG. 1 in that it represents a direct conversion of the analog PLL circuit form into a signal processing form.

In the DPLL circuit of FIG. 2, apart from the phase comparator 121 that compares the phases of the input timing signal and the reference clock, there is provided a phase difference detector 122 that detects the phase difference of these two signals. Reduction in the lock-in time is achieved by adjusting the rate by adding pulses to the pulse train from fixed oscillator 123 or removing pulses from this pulse train, in accordance with the phase difference detected by phase difference detector 122.

In more detail, the DPLL circuit shown in FIG. 2 comprises a phase comparator 121, phase difference detector 122, fixed oscillator 123, sequential loop filter 124, pulse addition or removal accelerator 125, pulse addition or removal circuit 126, and frequency divider 127.

Phase comparator 121 compares the phase of the timing signal that is received as input and the reference clock obtained by feedback. Binary quantization to −1 or +1 of the phase lead/lag with respect to the timing signal of the reference clock is then performed in each cycle of the carrier wave.

In accordance with the output of phase comparator 121, sequential loop filter 124 outputs a +1 pulse in a prescribed period whilst the reference clock lags the input timing signal and outputs a −1 pulse in a prescribed period whilst the reference clock leads the input timing signal.

Phase difference detector 122 detects the phase difference between the input timing signal and the reference clock. It then outputs a gate control signal corresponding to the detected phase difference to pulse addition or removal accelerator 125.

Pulse addition or removal accelerator 125 turns a gate on or off in response to a gate control signal from phase difference detector 122 to control the number of pulses from sequential loop filter 124. That is, pulse addition or removal accelerator 125 outputs all or some of the input pulses to pulse addition or removal circuit 126 depending on the gate control signal.

Pulse addition or removal circuit 126 receives pulses that are input from pulse addition or removal accelerator 125 and, in the case of +1 pulses, adds pulses of a number corresponding to the number of these pulses to the pulse train that is input from fixed oscillator 123. And in the case of −1 pulses, it removes pulses of a number corresponding to the number of these pulses from the pulse train that is input from fixed oscillator 123. The new pulse train that is thus obtained is then subjected to frequency division by frequency divider 127 and output as the reference clock.

Thus, in the DPLL circuit of FIG. 2, shortening of the lock-in time can be achieved if, when the phase difference between the timing signal and the reference clock is large, the number of pulses added or removed is made larger (i.e. if the frequency of operation is raised). Also, by raising the frequency of operation, jitter can be reduced.

A first problem with the conventional DPLL circuit is that attempts to shorten the lock-in time result in excessive increase in the size of the circuit.

The reason for this is that two phase comparators are necessary and, furthermore, a circuit such as a pulse addition or removal accelerator is required.

A second problem of the conventional DPLL circuit is that overshoot of the output phase of the phase comparator cannot be suppressed, so considerable time is required for lock-in.

The reason for this is that setting of the initial values etc. is not performed in the initial lock-in period.

SUMMARY OF THE INVENTION

An object of the present invention is to reduce the circuit size and shorten the lock-in time of a DPLL circuit employed in a receiver device for radio data communication which uses the GMSK modulation system. More specifically, an object of the present invention is to reduce overshoot of the phase output of the phase comparator circuit by enabling the loop action of the DPLL circuit to be commenced after setting the initial value of the integration term of the loop filter and numerically controlled oscillator (NCO) of the DPLL circuit.

According to the present invention there is provided a digital PLL circuit comprising a loop unit including means for phase comparison, means for phase adjustment, a loop filter, and a numerically controlled oscillator, further comprising: means for initial setting that find a mean frequency error and phase error information from continuous data corresponding to n+1 symbols of phase data that is continuously input to the means for phase comparison; means for delaying by an amount corresponding to one symbol the phase data that is continuously input by the means for phase comparison; and means for controlling timing that control the operating timing of the means for initial setting and the operating timing of the loop unit. The the mean frequency error is preset in the loop filter and that actuates the loop mean when the phase error information has been preset in the communication control oscillator.

The means for initial setting in the present invention includes; means for calculating frequency error that sequentially finds the difference of two successive phase data of the data corresponding to n+1 symbols, that integrates the differences to find an integrated value and then multiplies this by 1/n and takes this as the mean frequency error value; means for data latching that latches the phase data of the first symbol of the data corresponding to n+1 symbols; and means for calculating phase error that further integrates the integrated values over n symbols and multiplies the result by 2/n, which it then adds to the phase data latched by the means for data latching, and takes this as the phase error information.

Further according to the present invention there is provided a method of actuating a digital PLL circuit comprising a loop unit including means for phase comparison, means for phase adjustment, a loop filter, and a numerically controlled oscillator, comprising means for initial setting that finds a mean frequency error and phase error information from data corresponding to n+1 successive symbols of phase data that are successively input by the means for phase comparison; means for delaying that delays the phase data successively input to the means for phase comparison by an amount corresponding to one symbol; and means for controlling timing that controls the operating timing of the means for initial setting and the loop unit; wherein the means for phase comparison are actuated in a condition with the operation of said loop unit disabled, and said loop unit is actuated with a timing determined by the mean frequency error and the phase error information and the operation of the means for initial setting is then disabled.

Integration is performed over a n-symbol interval after finding the phase information difference of each symbol and removing the modulation component. The mean frequency error value over the n-symbol interval is taken as 1/n times the integrated value. Also, the phase error value at the time point when integration has been performed over n symbols is found by further integrating this already-integrated, frequency error value over an interval of a further n symbols and multiplying by 2/n, then adding to the initial phase. The loop unit is actuated after presetting the integration term of the loop filter of the loop unit to the mean frequency error value and presetting the integration term of the numerically controlled oscillator to the phase error value. Since the loop unit is actuated after performing initial setting, when actuation is performed, the input data value and the data value obtained by feedback are practically the same. The occurrence of overshoot can thereby be practically suppressed.

DESCRIPTION OF THE PREFERRED EMBODIMENTS

Embodiments of the present invention are now described below with reference to the drawings. First of all, a GMSK receiver employing a digital PLL circuit according to the present invention will be described with reference to FIG. 3.

Figure 3:
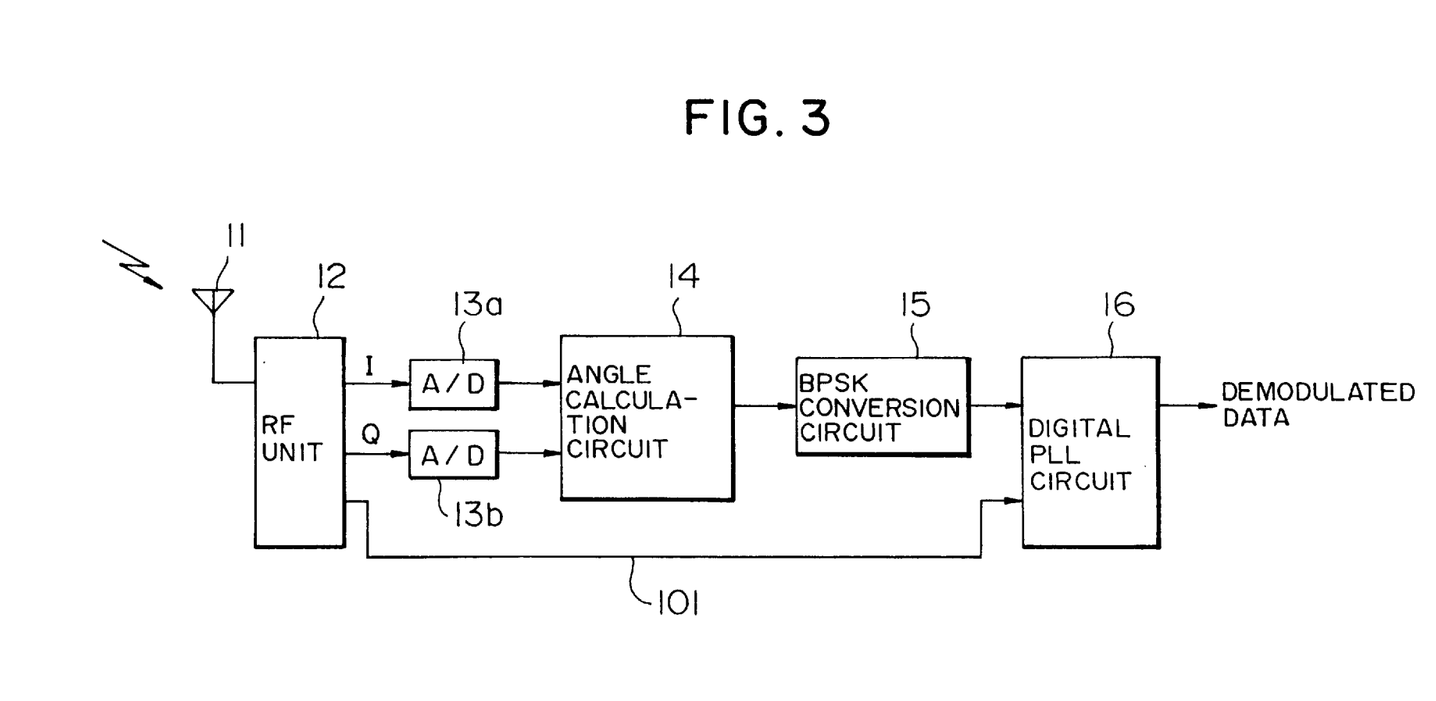
FIG. 3 is a block diagram showing an example of reception to which a digital PLL circuit according to the present invention is applied.

The GMSK receiver shown in FIG. 3 comprises an antenna 11, RF unit 12, A/D converters 13a, 13b, angle calculating circuit 14, BPSK conversion circuit 15, and a digital PLL circuit 16.

Antenna 11 receives a signal produced by GMSK modulation at the transmission end using a preamble and data signal. The signal that is received by antenna 11 is input to RF unit 12. When RF unit 12 inputs a signal exceeding a predetermined level, it communicates to the digital PLL circuit 16 a carrier signal 101 indicating this fact. Concurrently, RF unit 12 performs quadrature demodulation using the local signal obtained after passing the received input signal through a bandpass filter (BPF, not shown). The signal which is thus obtained can be regarded as a PSK modulation signal.

The signals that have been obtained by quadrature demodulation in RF unit 12, that is, in-phase component I and quadrature component Q, are input to respective A/D converters 13a and 13b. A/D converters 13a, 13b subject the respectively input signals to analog/digital conversion before outputting them to angle calculating circuit 14.

Angle calculating circuit 14 extracts the phase information from the input in-phase component I and quadrature component Q. That is, it performs the calculation: $\tan^{-1}(Q/I)$. The calculation of $\tan^{-1}(Q/I)$ could be implemented using a digital circuit or digital signal processor (DSP) etc., but a fast calculation speed with hardware of simple construction can easily be implemented by using a ROM (Read Only Memory) table. Also, increasing the number of output bits of angle calculation circuit 14 would increase the accuracy, but, since the next-stage processing is thereby made more complicated, about 6 bits is preferable.

Next, the phase information that is output from angle calculation circuit 14 is input to BPSK conversion circuit 15. BPSK conversion circuit 15 performs phase conversion of the input phase information such that the GMSK modulation can be regarded as BPSK modulation in order to facilitate processing in subsequent stages. Specifically, BPSK conversion circuit 15 repetitively adds 0, $+\pi/2$, $+2\pi/2$, and $+3\pi/2$ sequentially to the incoming phase information. That is, when "0" is sent in GMSK modulation, a phase conversion of $-\pi/2$ is applied, and when "1" is sent, phase conversion of $+\pi/2$ is applied. When these values are sequentially summed, when "0" is sent, the phase does not change, but when "1" is sent, the phase is changed by $+\pi$. Consequently, if phase conversion as described above is performed, GMSK modulation can be regarded as BPSK modulation.

For example, if we assume that the data sent from the sending end is "0", "1", "1", "0", the phase information output from the angle calculation circuit 14 in the ideal condition would be "$-\pi/2$, 0, $+\pi/2$, 0". The output phases of the BPSK modulation circuit 15 are then: "$+3\pi/2(=-\pi/2)$, $+\pi/2$, $+3\pi/2$, $+3\pi/2$", which can be regarded as BPSK modulation.

By performing the process as described above, the BPSK phase data (for example, 6 bit data) that is output from BPSK conversion circuit 15 is input to digital PLL circuit 16, where data demodulation is performed. An embodiment of digital PLL circuit 16 will now be described in detail with reference to FIG. 4.

Figure 4:
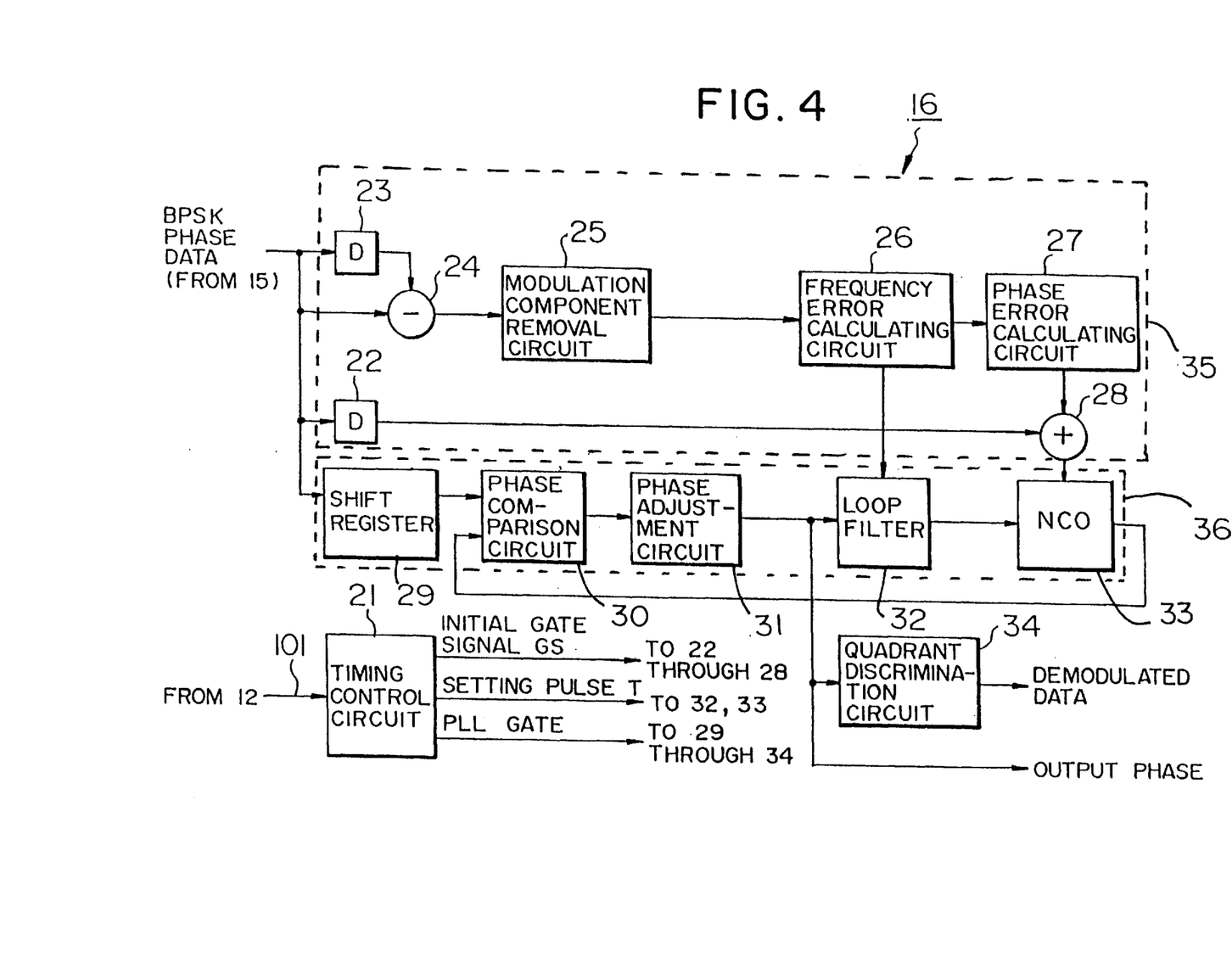
FIG. 4 is a block diagram showing an embodiment of a digital PLL circuit according to the present invention.

As shown in FIG. 4, digital PLL circuit 16 comprises timing control circuit 21, data latch circuits 22, 23, subtractor 24, modulation component removal circuit 25, frequency error calculation circuit 26, phase error calculation circuit 27, adder 28, shift register 29, phase comparison circuit 30, phase adjustment circuit 31, loop filter 32, numerically controlled oscillator (NCO which is called digital VCO) 33, and quadrant discrimination circuit 34. Data latch circuits 22, 23, subtractor 24, modulation component removal circuit 25, frequency error calculation circuit 26, phase error calculation circuit 27, and adder 28 constitute the initial setting unit 35, while shift register 29, phase comparison circuit 30, phase adjustment circuit 31, loop filter 32 and NCO 33 constitute loop unit 36. The action of this digital PLL circuit 16 will now be described.

When timing control circuit 21 inputs carrier signal 101 from RF unit 12, it outputs initial gate signal GS. Subsequently, it generates a setting pulse T and PLL gate signal with prescribed timings.

Figure 5:
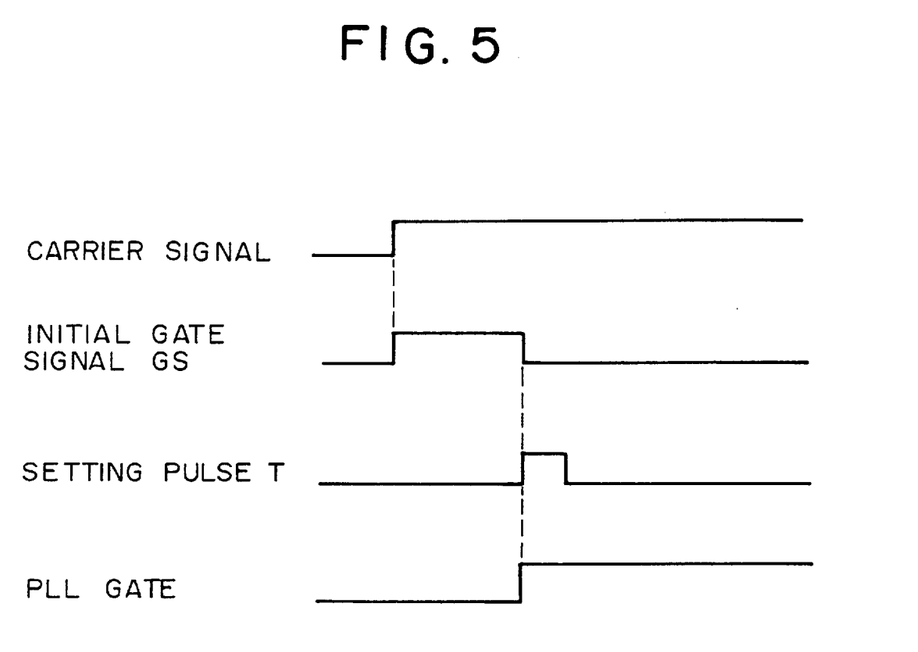
FIG. 5 is a timing diagram for explanation of the operation of the timing control circuit shown in FIG. 4.

Initial gate signal GS defines the operating period of initial setting unit 35, and is supplied to all the circuits that participate in the initial setting operation, namely, data latch circuits 22, 23, subtractor 24, modulation component removal circuit 25, frequency error calculating circuit 26, phase error calculating circuit 27, and adder 28. The PLL gate signal defines t he operating period of loop unit 36 and is supplied to all the circuits that execute PLL operation, namely, shift register 29, phase comparison circuit 30, phase adjustment circuit 31, loop filter 32, NCO 33 and quadrant discrimination circuit 34. Setting pulse T is supplied to loop filter 32 and NCO 33 in order to preset in loop unit 36 the initial values that are output from initial setting unit 35. A timing chart of these signals is shown in FIG. 5.

Next, the initial setting operation of digital PLL circuit 16 will be described. Data latch circuit 22 latches the phase data (initial phase data) that is output first of all from BPSK conversion circuit 15. Also, data latch circuit 23 latches, one symbol at a time, the phase data that are successively input, and outputs these to subtractor 24. Subtractor 24 obtains the difference between the phase data from data latch circuit 23 and the phase data that are newly output from BPSK conversion circuit 15 (i.e. it performs differential demodulation). In this way, the phase difference information for each symbol can be obtained. However, this phase difference information contains a modulation component.

Modulation component removal circuit 25 removes the modulation component contained in the phase difference information from subtractor 24. Specifically, it masks the most significant bit of the phase difference information that is input. In this way, pure phase difference information, not containing a modulation component, is obtained. In the case where the signal that is input to this digital PLL circuit 16 is QPSK phase data (6 bits), pure phase difference information is obtained by masking the most significant two bits.

The phase difference information that is output from modulation component removal circuit 25 is input to frequency error calculating circuit 26. Frequency error calculating circuit 26 comprises a data latch circuit and adder (not shown), and successively integrates the phase difference information that is input over an interval of n symbols (for example an interval of 8 symbols). Frequency error calculating circuit 26 then outputs this value to phase error calculating circuit 27 every time this integration calculation proceeds by an amount corresponding to one symbol. Also, frequency error calculating circuit 26 multiplies the finally obtained integrated value by 1/n (in for example the case of multiplication by 1/8, this can be implemented simply by a bit shift). The mean frequency error value per symbol is thereby obtained. This mean frequency error value is output to loop filter 32.

If for example the BPSK phase data that are input to digital PLL circuit 16 are assumed to be $a_1, a_2, a_3, \ldots, a_{n-2}, a_n, a_{n+1}$, the phase difference information that is output from subtractor 24 is: $(a_i-a_{i-1})$, i=2, 3, . . . , n, n+1. If now, for convenience in explanation, we assume that the BPSK phase data do not contain a modulation component (if the angle calculating circuit 14 delivers 6 output bits, these data are the least significant 5 bits i.e. excluding the most significant bit), the successive inputs to frequency error calculating circuit 26 are: $(a_2-a_1), (a_3-a_2), \ldots, (a_{n+1}-a_n)$. Frequency error calculating circuit 26 continuously integrates the input phase difference information and outputs it to phase error calculating circuit 27. That is, frequency error calculating circuit 26 outputs to phase error calculating circuit 27 the sequence: $(a_2-a_1)$, $(a_2-a_1)+(a_3-a_2)$, . . . , $(a_2-a_1)+(a_3-a_2)+ \ldots +(a_n-a_{n-1})+(a_{n+1}-a_n)$.

Furthermore, frequency error calculating circuit 26 multiplies the value integrated over an interval of n symbols by 1/n. That is, frequency error calculating circuit 26 performs the calculation expressed by equation (1) below to find the mean frequency error value per symbol.

$$\frac{\sum_{i=2}^{n+1}(a_i - a_{i-1})}{n} \quad (1)$$

Increasing the value of n makes the value of the mean frequency error obtained as above more accurate, since more widely dispersed values are taken. However, due to the trade-off relationship with the length of the preamble of the received signal, a value of about 8 symbols is suitable. Also, if n is set to a power of 2 ($2^m$,: m=0, 1, 2, . . . ), the division in the bit calculation in the subsequent stage can be effected by a simple bit shift.

The mean frequency error value found by frequency error calculating circuit 26 is output to loop filter 32.

Phase error calculating circuit 27 further integrates the integrated values that are successively input from frequency error calculating circuit 26 over a range of n symbols, using a data latch circuit and adder, not shown. That is, it performs the calculation shown in equation (2).

$$\sum_{j=2}^{n}\sum_{i=2}^{j}(a_i - a_{i-1}) \quad (2)$$

Phase error calculating circuit 27 then multiplies the integrated value obtained by 2/n, and outputs it to adder 28.

Adder 28 adds the initial phase data held by data latch circuit 22 to the output value from phase error calculating circuit 27. Phase error information at a time point where integration has been performed n times is thereby obtained. The phase difference information obtained is output to NCO 33.

Figure 6:
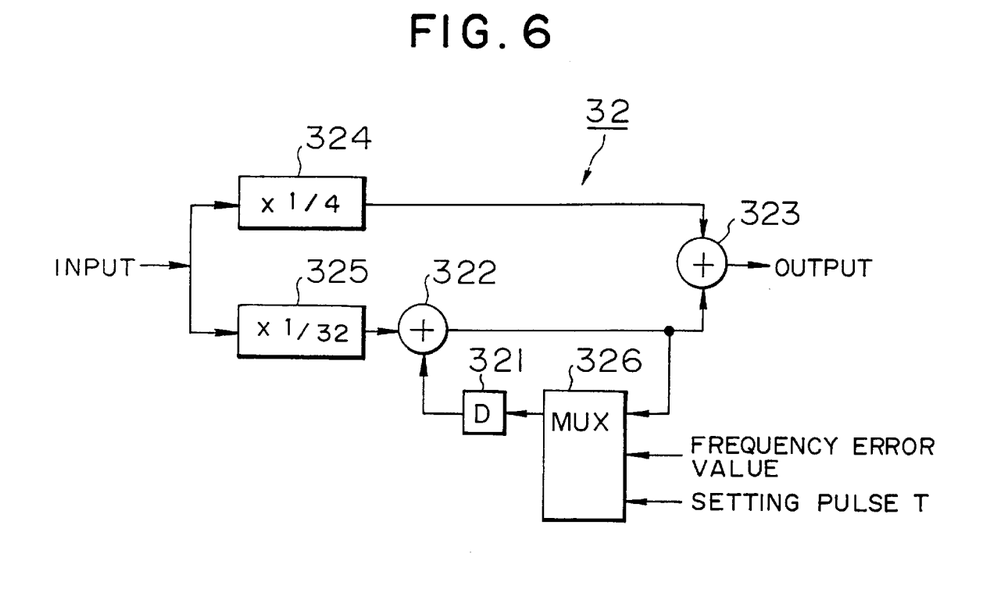
FIG. 6 is a block diagram showing an example of the construction of a loop filter 32 shown in FIG. 4.
Figure 7:
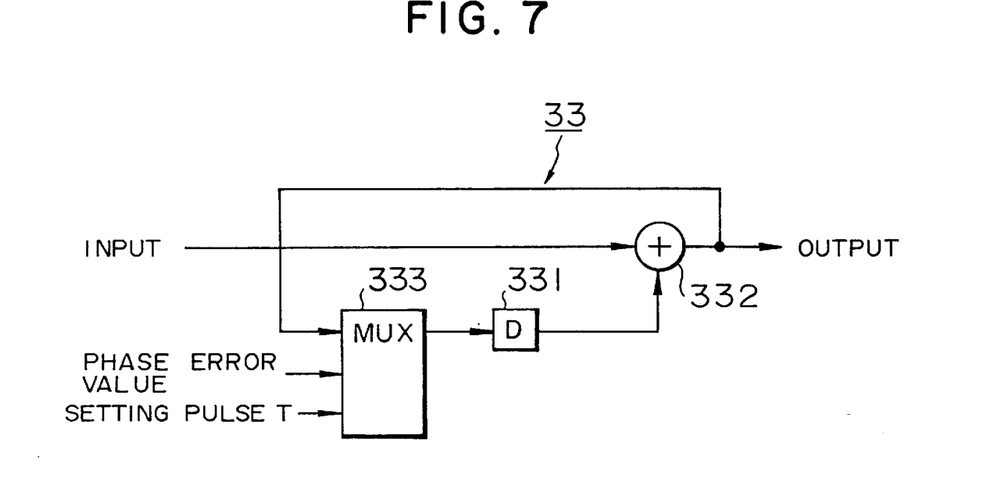
FIG. 7 is a block diagram showing an example of the construction of a numerically controlled oscillator 33 shown in FIG. 4.

Loop filter 32 and NCO 33 may be constructed for example as shown in FIG. 6 and FIG. 7 respectively. In detail, as shown in FIG. 6, loop filter 32 is basically a loop integrator employing a data latch circuit 321 and adders 322, 323, and comprising digital filters 324, 325 and a multiplexer (MUX) 326. Also, NCO 33, as shown in FIG. 7, like loop filter 32, is basically a loop integrator, and comprises a data latch circuit 331, adder 332 and multiplexer 333.

The mean frequency error value from frequency error calculating circuit 26 and the phase difference information from adder 28 are respectively input to multiplexer (MUX) 326 and multiplexer (MUX) 333. These multiplexers 326 and 333 also input a setting pulse T. Setting pulse T is output from timing control circuit 21 at the timing at which the calculation processing of an n-symbol interval has been completed.

Multiplexers 326 and 333, in response to setting pulse T, respectively output the mean frequency error value and phase difference information to data latch circuit 321 and data latch circuit 331. That is, the mean frequency error value and phase difference information are respectively preset by setting pulse T in the respective integration terms of loop filter 32 and NCO 33.

Next, when the initial setting operation of digital PLL circuit 16 has been completed as described above, PLL operation is commenced. Shift register 29 delays the BPSK phase data that is input to it by an amount corresponding to one symbol, in order to adjust the output timing of initial setting unit 35 and the operation commencement timing of loop unit 36.

Phase comparison circuit 30 is a simple subtractor that subtracts the output value of NCO 33 from the input BPSK phase data. Thus an output phase synchronized with the carrier wave is obtained from phase comparison circuit 30. That is, an output phase is obtained from which the effect of offset of the frequencies of the oscillators at the sending end and the receiving end has been removed.

Phase adjustment circuit 31 removes the sending-end modulation component from the phase signal that is input from phase comparison circuit 30. This circuit can be implemented by a MOD ($\pi$) circuit in the case where the mode of modulation is BPSK, or by a MOD ($\pi/2$) circuit in the case where the mode of modulation is QPSK. This phase adjustment circuit 31 also adds an offset value ($\pi/2$) in order to facilitate the decision process performed by quadrant discrimination circuit 34.

Quadrant discrimination circuit 34 performs differential detection of the output of phase adjustment circuit 31. That is, it finds the difference between the present output phase and the previous output phase at each symbol and determines the demodulation data depending on whether this result is an I or Q quadrant.

Also, the output of phase adjustment circuit 31 is output to the outside in order to monitor the operating condition of loop unit 36 or to monitor the circuit condition by finding the quality of the phase data using the least significant bits from which the modulation component has been removed.

Referring once more to FIG. 6, the output from phase adjustment circuit 31 that was input to loop filter 32 is branched into two, and these are respectively input to digital filters 324, 325. The output of digital filter 324 (filter coefficient×1/4) is directly input to adder 323. In contrast, the output of digital filter 325 (filter coefficient×1/32) has the value latched by data latch circuit 321 added to it by adder 322 before being input to adder 323. Adder 323 adds these two input values and outputs the result to NCO 33.

As shown in FIG. 7, in NCO 33, the value latched by data latch circuit 331 is added to the value input from loop filter 32.

Figure 8:
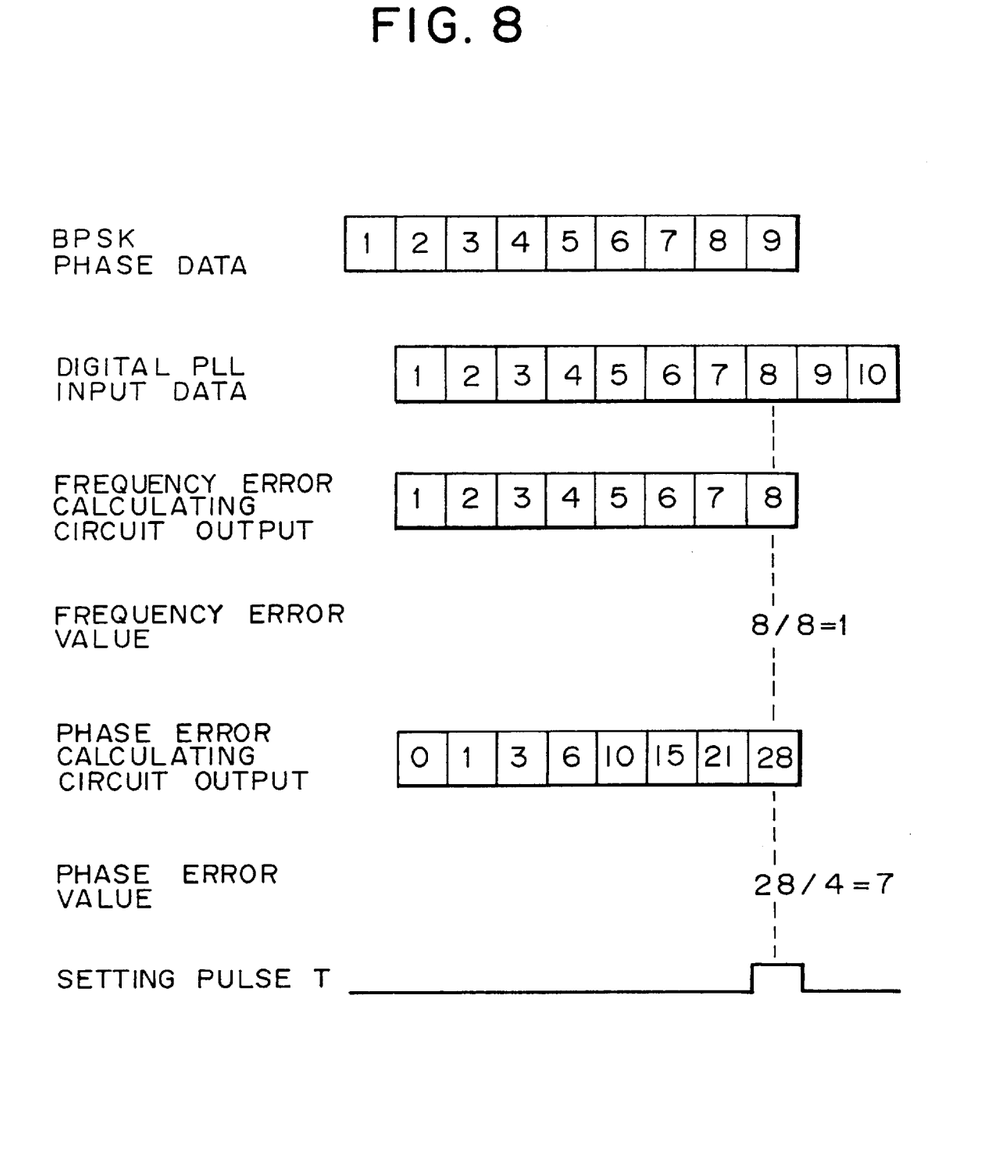
FIG. 8 depicts the operation of loop unit 36 shown in FIG. 4.

Let us now consider the case where, as shown in FIG. 8, the BPSK phase data (assumed not to contain any modulation component) that are input to digital PLL circuit 16 begin with "1", and increase by one each time, as: 1, 2, 3, 8, 9, . . . . In this case, the data are input to phase comparison circuit 30 delayed by a delay (corresponding to one symbol) produced by shift register 29.

For its part, the integrated value in frequency error integration circuit 26 is, successively, 1, 2, 3, . . . i.e. the result of successive addition of these increases of one in each case of the BPSK phase data; thus it becomes "8" after eight symbols. Consequently, the mean frequency error value that is output to loop filter 32 from frequency error calculating circuit 26 is 8/8=1.

Also, the integrated value in phase error calculating circuit 27 after 8 symbols is "28". Consequently, the output of phase error calculating circuit 27 is the value obtained by dividing "28" by 8/2=4 i.e. it is "7". To this value is added the initial phase data "1" that was latched by data latch circuit 22, and the result, "8", is supplied to NCO 33 as the phase error information. At this point, if setting pulse T is being output from timing control circuit 21, the output of NCO 33 becomes "8". That is, if the output of shift register 29 is "8", the output of the NCO is "8". Consequently, the output of phase comparison circuit 30 is "0". That is, the output phase of loop unit 36 is locked. Phase adjustment circuit 31 now adds an offset value of $\pi/2$, so its output phase is locked at $\pi/2$.

Figure 9A:
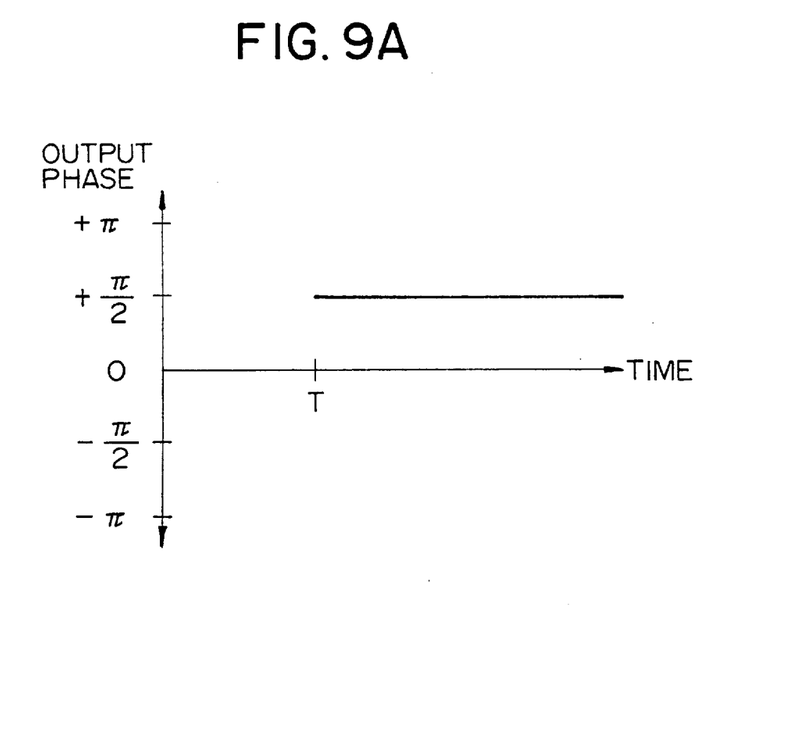
FIG. 9A is a graph showing the output phase with respect to time of loop unit 36 shown in FIG. 4.
Figure 9B:
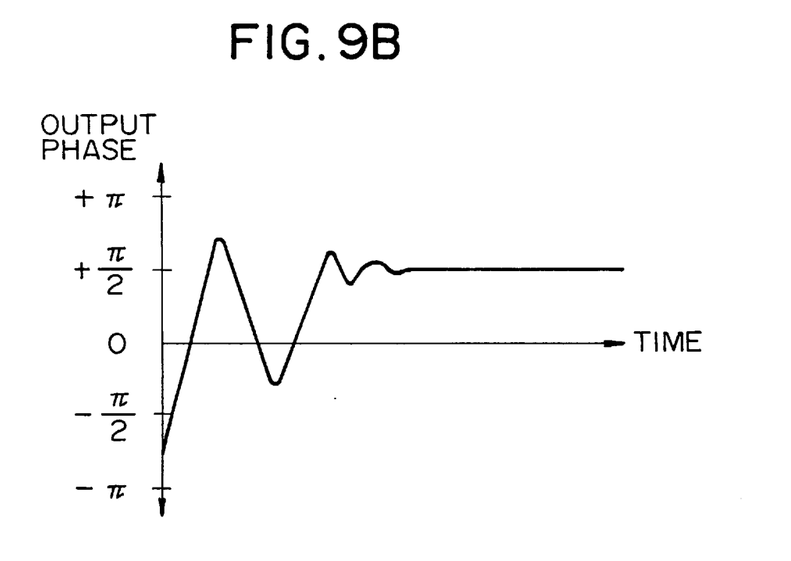
FIG. 9B is a graph like FIG. 9A of the case where operation of the initial setting unit is disabled.

Thus, in the digital PLL circuit 16 of FIG. 4, loop unit 36 starts operation at the timing where setting pulse T is output, and its output phase is concurrently locked at the prescribed value. FIG. 9A shows the relationship between the output phase and the lapsed time after commencement of operation of this digital PLL circuit 16. For comparison, FIG. 9B shows the relationship between the output phase and time in the case where operation of initial setting unit 35 is disabled (corresponding to a DPLL of the conventional phase addition signal processing type). As is clear from FIGS. 9A and 9B, if, by disabling the operation of initial setting unit 35, loop unit 36 is actuated right from the start, overshoot occurs with the result that some time is required before the output phase becomes stable. In contrast, with this embodiment, there is no overshoot at all, and locking occurs instantaneously at the time point of setting pulse T. However, it should be noted that if distortion is present in the input BPSK data, locking is not instantaneous, but, providing the S/N condition is comparatively good, the input data and the NCO 33 output value give extremely close values, so the locked condition is produced with minimal delay.

Figure 10:
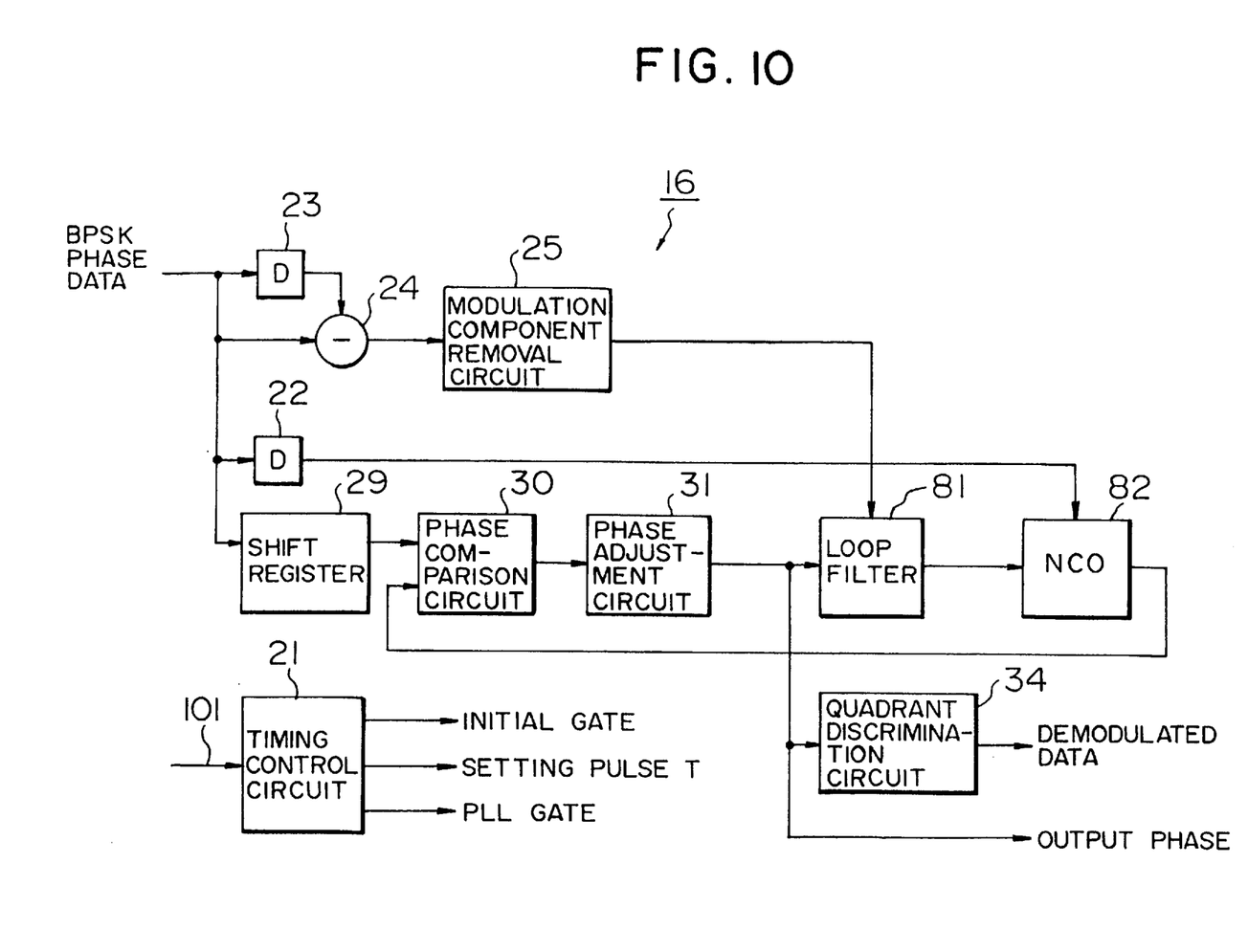
FIG. 10 is a block diagram showing a further embodiment of a digital PLL circuit according to the present invention.

A further embodiment of digital PLL circuit 16 will now be described with reference to FIG. 10. Items which are identical to items in FIG. 4 will be given the same reference symbols and further description omitted.

Figure 11:
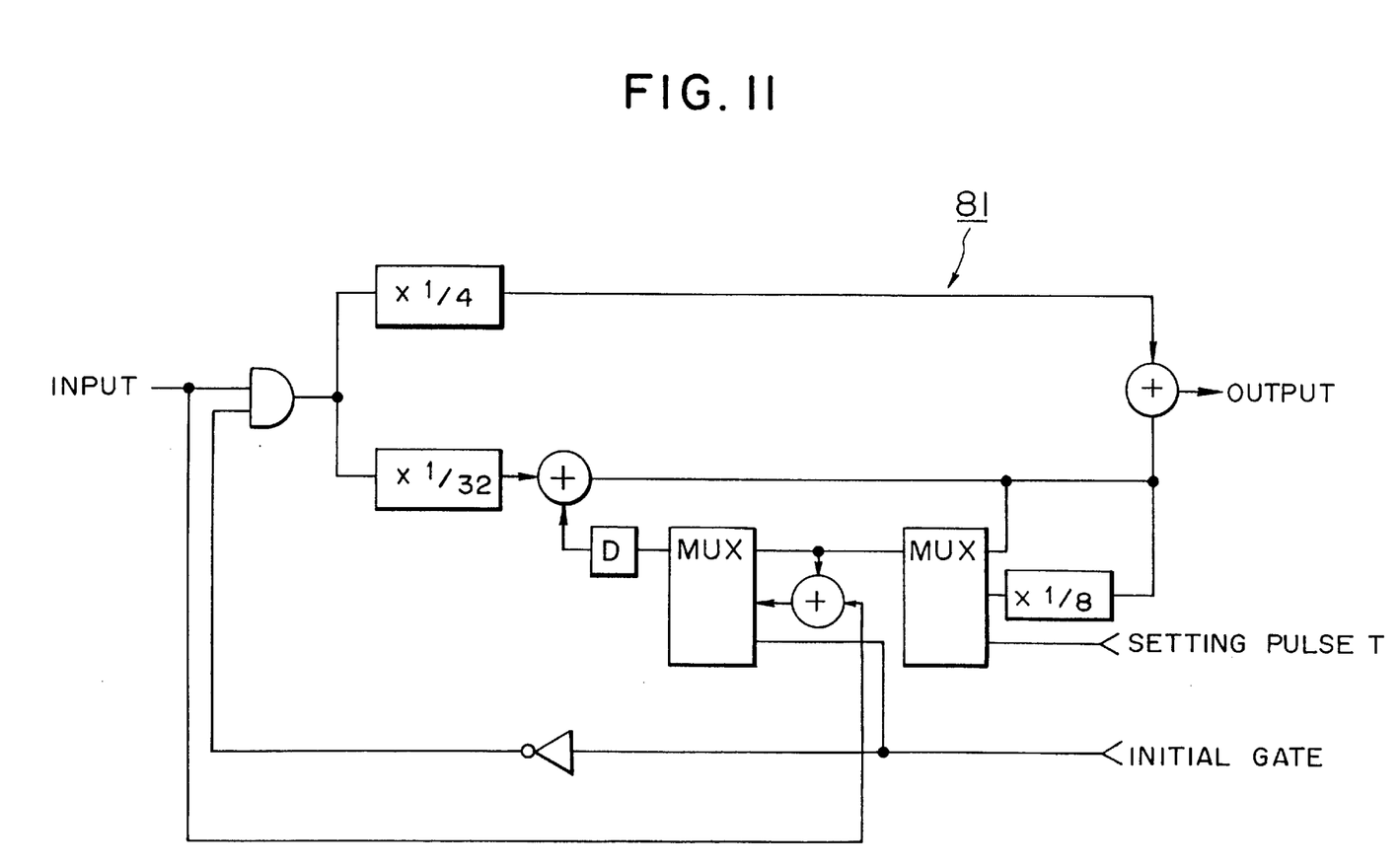
FIG. 11 is a block diagram showing an example of the construction of loop filter 81 shown in FIG. 10.
Figure 12:
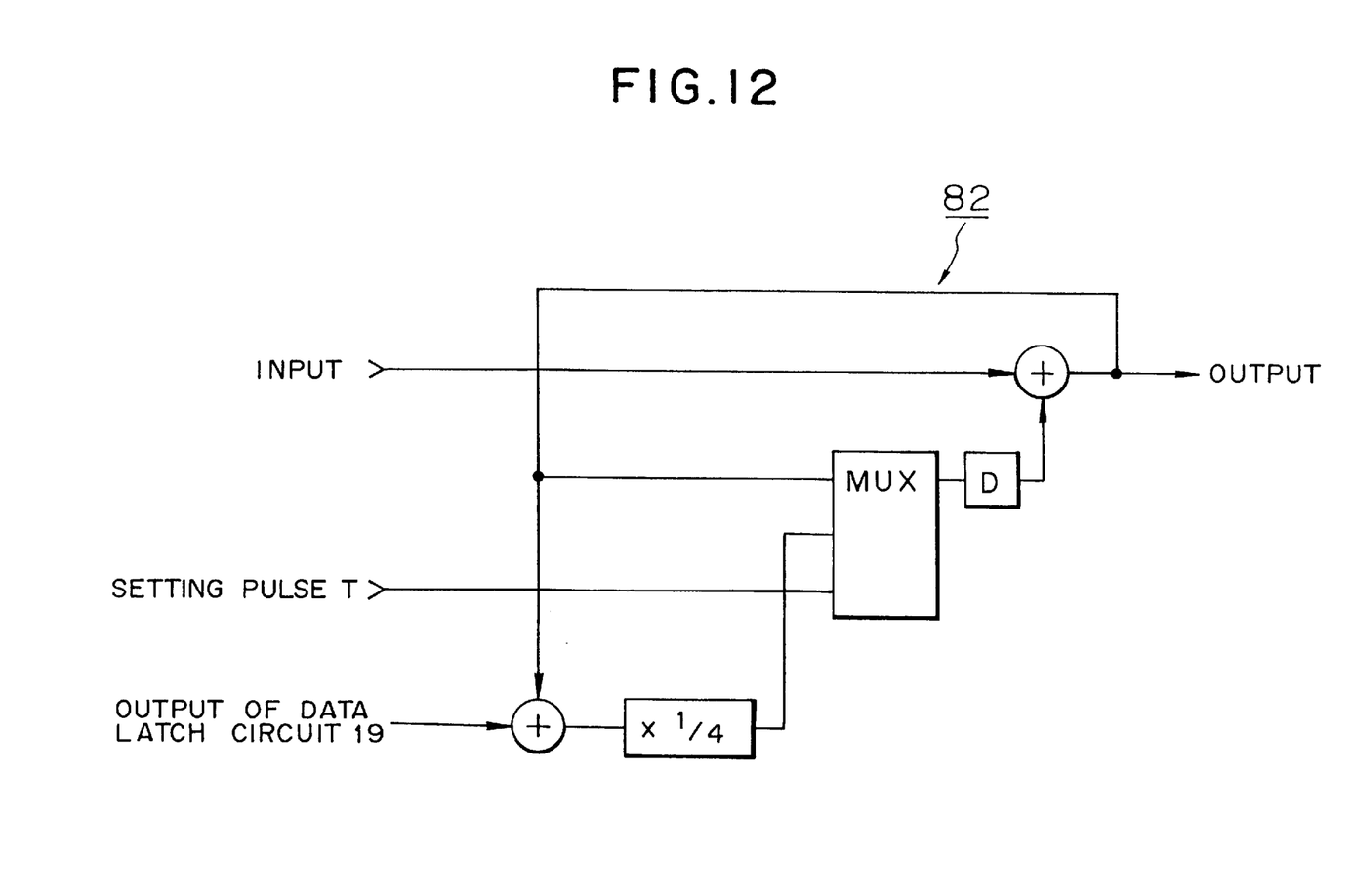
FIG. 12 is a block diagram showing an example of the construction of NCO 82 shown in FIG. 10.

Noting the fact that, in this digital PLL circuit 16, frequency error calculating circuit 26, phase error calculating circuit 27, loop filter 32 and NCO 33 in FIG. 4 each consist of a loop integrator, a construction can be adopted in which these loop integrators are made common, being switched by for example a multiplexer. Specifically, loop filter 81 and NCO 82 also serve as the frequency error calculating circuit and phase error calculating circuit respectively. By means of such a construction, the size of the circuit of the digital PLL circuit 16 of this embodiment can be curtailed while yet providing equivalent functionality to the digital PLL circuit of FIG. 4. FIG. 11 shows a constructional example of such a loop filter and FIG. 12 shows a constructional example of such an NCO.

With the present invention, the loop lock-in time can be shortened by providing an initial setting unit that sets an initial value in the loop unit of the digital PLL circuit, so that the loop is only actuated after the initial setting.

Also, with the present invention, since the lock-in time is shortened, when this invention is applied to a receiver (demodulator), synchronization can be obtained using only a very short preamble time included in the received signal.

What is claimed is:

1. A digital Phase lock loop (PLL) circuit comprising a loop unit including means for phase comparison, means for phase adjustment, a loop filter and a numerically controlled oscillator, said digital Phase lock loop (PLL) circuit further including:

means for initial setting that find a mean frequency error and phase error information from continuous data corresponding to n+1 symbols of phase data that is continuously input to said means for phase comparison, said means for initial setting presetting said mean frequency error in said loop filter and presetting said phase error information in said numerically controlled oscillator;

means for delaying the phase data that is continuously input by said means for phase comparison, said delay being an amount corresponding to one symbol; and means for controlling an operating timing of said means for initial setting and for controlling an operating timing of said loop unit, whereby said loop unit is actuated when said mean frequency error is preset in said loop filter and when said phase error information has been preset in said numerically controlled oscillator.

2. The digital Phase lock loop (PLL) circuit according to claim 1, wherein said means for initial setting comprise means for calculating frequency error that sequentially finds the difference to two successive phase data of said data corresponding to n+1 symbols, that integrates said differences to find an integrated value and then multiples said integrated value by 1/n to obtain said mean frequency error value; means for data latching that latches the phase data of a first symbol of said data corresponding to n+1 symbols; and means for calculating phase error that further integrates said integrated value over n symbols and multiplies the result by 2/n, which it then adds to said phase data latched by said means for data latching to obtain said phase error information.

3. The digital Phase lock loop (PLL) circuit according to claim 1 wherein said loop filter and, said numerically controlled oscillator respectively comprise a loop integrator.

4. A method for initial setting of a digital Phase lock loop (DPLL) circuit comprising a loop unit including means for phase comparison, means for phase adjustment, a loop filter, and a numerically controlled oscillator, said method comprising:

initial setting that finds a mean frequency error and phase error information from data corresponding to n+1 successive symbols of phase data that are successively input by said means for phase comparison;

delaying the phase data successively input to said means for phase comparison by an amount corresponding to one symbol; and controlling operating timing of said means for initial setting and said loop unit;

wherein said means for phase comparison are actuated in a condition with the operation of said loop unit disabled, and wherein said loop unit is actuated with a timing determined by said mean frequency error and said phase error information and the operation of said means for initial setting is then disabled.

5. The digital circuit according to claim 2, wherein said loop filter and, said numerically controlled oscillator respectively comprise a loop integrator.

* * * * *